United States Patent [19]

Tomisawa

[11] Patent Number: 4,742,254

[45] Date of Patent: May 3, 1988

[54] CMOS INTEGRATED CIRCUIT FOR SIGNAL DELAY

[75] Inventor: Norio Tomisawa, Hamamatsu, Japan

[73] Assignee: Nippon Gakki Seizo Kabushiki Kaisha, Hamamatsu, Japan

[21] Appl. No.: 914,377

[22] Filed: Oct. 1, 1986

[30] Foreign Application Priority Data

Oct. 7, 1985 [JP] Japan .................................. 60-221786
Oct. 7, 1985 [JP] Japan .................................. 60-221787

[51] Int. Cl.[4] ..................... H03K 5/159; H03K 19/094
[52] U.S. Cl. ......................................... 307/606; 328/56; 307/451; 357/42
[58] Field of Search ................ 307/605, 606, 303, 304, 307/451; 328/55, 56; 377/76; 357/42, 45

[56] References Cited

U.S. PATENT DOCUMENTS

| | | | |
|---|---|---|---|
| 3,378,783 | 4/1968 | Gibson | 307/605 X |
| 3,921,101 | 11/1975 | McCoy et al. | 307/605 X |
| 3,931,588 | 1/1976 | Gehweiler | 331/108 A X |
| 4,069,429 | 1/1978 | White et al. | 307/451 X |
| 4,344,002 | 8/1982 | Chao | 307/304 X |
| 4,504,785 | 3/1985 | Tucker et al. | 328/56 X |
| 4,504,791 | 3/1985 | Conway et al. | 328/56 X |

OTHER PUBLICATIONS

RCA COS/MOS Integrated Circuits Manual, 1971 p.24.

Primary Examiner—John S. Heyman
Attorney, Agent, or Firm—Spensley Horn Jubas & Lubitz

[57] ABSTRACT

A CMOS integrated circuit for signal delay comprises CMOS gate circuits connected in multiple stages which deliver out an input binary signal after delaying it by a predetermined delay time. The CMOS gate circuits are arranged in a folded pattern on an integrated circuit substrate and each row of the folded pattern including a part of the CMOS gate circuits in stages of an odd number. Each of the CMOS gate circuits consists of an N channel element and a P channel element cascade-connected to each other and gate patterns of the respective channels have their width and length adjusted in such a manner that value of operating currents in these elements become equal to each other when the same external voltage has been applied to these elements.

12 Claims, 14 Drawing Sheets

| STAGE NUMBER | INPUT | 1 | 2 | 3 | 4 | --- | 199 | 200(1) INCLUDING FOLDING PORTION 36) |
|---|---|---|---|---|---|---|---|---|
| CMOS GATE CKT. 20 IN ROW 22 | ○ | ▷○ 20 | ▷○ 20 | ▷○ | ▷○ | --- | ▷○ | ▷○ ⌐36 |
| RISE PORTION a — WAVEFORM | ╱ (RISE) | ╱ | ╱ | ╱ | ╱ | --- | ╱ | ╱ |
| RISE PORTION a — DELAY TIME | | tf | tr | tf | tr | --- | tf | $tr[tr(1+k)]$ |
| FALL PORTION b — WAVEFORM | ╲ (FALL) | ╲ | ╲ | ╲ | ╲ | --- | ╲ | ╲ |
| FALL PORTION b — DELAY TIME | | tr | tf | tr | tf | --- | tr | $tf[tf(1+k)]$ |

FIG. 8

| STAGE NUMBER | INPUT | 1 | 2 | 3 | 4 | ... | 199 | 200 | 201 (INCLUDING FOLDING PORTION 36) |
|---|---|---|---|---|---|---|---|---|---|
| CMOS GATE CKT. 20 IN ROW 22 | ○ | ▷∘ 20 | ▷∘ 20 | ▷∘ | ▷∘ | --- | ▷∘ | ▷∘ | ▷∘ 36 |
| RISE PORTION a — WAVEFORM | ╱ (RISE) | ╲ | ╱ | ╲ | ╱ | --- | ╲ | ╱ | ╲ |
| RISE PORTION a — DELAY TIME | | $tf$ | $tr$ | $tf$ | $tr$ | --- | $tf$ | $tr$ | $tf(1+k)$ |
| FALL PORTION b — WAVEFORM | ╲ (FALL) | ╱ | ╲ | ╱ | ╲ | --- | ╱ | ╲ | ╱ |
| FALL PORTION b — DELAY TIME | | $tr$ | $tf$ | $tr$ | $tf$ | --- | $tr$ | $tf$ | $tr(1+k)$ |

(INPUT WAVEFORM): a �older b

FIG. 9

CMOS INTEGRATED CIRCUIT FOR SIGNAL DELAY

BACKGROUND OF THE INVENTION

This invention relates to a CMOS integrated circuit for signal delay which is capable of realizing an effective IC pattern when integrating delay circuits for binary signals by using CMOS (complementary metal oxide semiconductor) gates and which is capable of reducing waveform distortion (undesired fluctuation in time base) in a delayed output in the integrated circuit.

In a CMOS gate circuit, as shown in FIG. 2, a P-channel MOS-FET 12 and an N-channel MOS-FET 14 are connected in their gates and drains respectively to each other, power source voltages $V_{DD}$ and $V_{SS}$ are respectively applied in sources, signals are applied at the gates via an input terminal 13, and inverted signals of the input signals are taken out from an output terminal 15 via drains.

A delay time occurs between input and output in such a CMOS gate circuit 10. As shown in FIG. 3, the delay time depends on the power source voltage $V_{DD}-V_{SS}$, and the smaller the power source voltage $V_{DD}-V_{SS}$ is, the larger become the delay time and the rate of change. This is because the conductance of elements varies depending on the value of the power source voltage $V_{DD}-V_{SS}$. The delay time therefore can be controlled at a desired value by selecting a suitable power source voltage, utilizing the above characteristics.

The signal delay circuit with CMOS gate circuit 10 of this type is applicable, for instance, in techniques for delaying pulse-frequency modulation (PFM) signals including analog data in time base (e.g. absorption of jitter or of fluctuation in time base among reproduced video signals in a video disc playback device). More particularly, reproduced video signals including jitters are applied at a CMOS gate circuit, color bursts are extracted from the video signals outputted from the CMOS gate circuit, the extracted signals are compared in phase with a crystal oscillated clock of 3.58 MHz corresponding to the subcarrier of the color bursts to derive a phase error, and the power source voltage $V_{DD}-V_{SS}$ in the CMOS gate circuit is controlled in accordance with the phase error to thereby output video signals from the CMOS gate circuit from which jitters have already been absorbed.

When a long delay time is required, CMOS gate circuits 10 should be connected in series as shown in FIG. 4. When they are integrated as ICs, power source lines 16, 17 could become wired over a long distance. By integration, however, as the width of the power lines 16, 17 decreases and the impedance of the lines accordingly increases, power source voltage changes unexpectedly to cause the delay time control to become unstable.

This invention attempts to solve such a problem by folding a continuous pattern of CMOS gate circuits in multiple-stage connection as is described in more detail hereinafter.

Folding of such patterns, however, may cause the following inconveniences:

(1) When simply folded, difference occurs between a delay time $T_r$ at a rise portion of an input waveform and a delay time $T_f$ at a fall portion thereof to cause distortion in output waveform (change in duty). With such a defect, the circuit will not be usable for video signal having data in time base reproduced from a video disc.

(2) The upper limit of operable frequency is lowered at folding portion due to the decrease of current supply capacity.

(3) A large number of CMOS gates are actuated at the same time to respond to a periodic input signal to often cause an unexpected voltage drop by the concentration of the operating current. This makes the delay time control unreliable.

SUMMARY OF THE INVENTION

It is, therefore, an object of the invention to solve the problems encountered in the prior art and provide a CMOS integrated circuit for signal delay which is capable of reducing the length of power lines to prevent an increase in impedance therein and of preventing output waveform distortion by arranging CMOS gate circuits in a folded pattern without causing the inconveniences from such folded pattern of CMOS gate circuits.

The CMOS integrated circuit for signal delay achieving the object of the invention is characterized in that it comprises CMOS gate circuits connected in multiple-stages which deliver out an input binary signal after delaying it by a predetermined delay time, the CMOS gate circuits being arranged in a folded pattern on an integrated circuit substrate and each row of the folded pattern including a part of the CMOS gate circuits in stages of an odd number.

By folding a continuous pattern, this invention enables power source lines ($V_{DD}$, $V_{SS}$) to be wired in a manner to oppose each other alternately as in the forms of combs. By this arrangement, this invention can minimize disadvantageous influence of the increased impedance in power source lines.

By forming each row with CMOS gate circuits of an odd number, the factors to cause fluctuation in delay time at folding positions can be effectively offset to thereby make delay times at the rise and fall portions ($T_R$, $T_F$) in the whole circuit uniform and thus prevent occurrence of output waveform distortion.

In another aspect of the invention, each of the CMOS gate circuits consists of an N channel element and a P channel element connected in series to each other and gate pattern of the respective channels have their width and length adjusted in such a manner that values of operating currents in these elements become equal to each other when the same external voltage has been applied to these elements. Preferably, the ratio of width to length of the gate pattern of the N channel element is smaller than that of the gate pattern of the P channel element. By this arrangement, the rise rime and the fall time become equal to each other and the waveform distortion between the input and output signals can be prevented.

In another aspect of the invention, decrease in operating speed in CMOS gates which is otherwise caused by increase in load capacity in folding positions and the reduction in responsiveness to changes in the speed of input sognals can be prevented by arranging a CMOS gate circuit having a large current supply capacity at the last stage of each row. By this arrangement, the upper limit of operable frequencies will not become lowered and transmission without waveform distortion can be realized even at a high speed input.

In still another aspect of the invention, each row is devided into blocks of an odd number having stages of an odd number and a CMOS gate circuit having a large current supply capacity is arranged at the last stage of each block. Whether or not the period of input signals is an integer multiple of delay times at each stage, operating timing of each CMOS gate element becomes staggered even for periodic input to thereby prevent concentration of operating current. There are no changes in power source voltages $V_{DD}$ and $V_{SS}$ nor unexpected changes in delay times to thereby enable transmission to be carried out without waveform distortion between input and output. By forming stages of each block in different odd numbers, this effect is applicable for all the inputs of the frequencies with a predetermined band width.

BRIEF DESCRIPTION OF THE DRAWINGS

In the accompanying drawings:

FIG. 8 is a view to show operation at each stage when the number of stages of a row is an even number;

FIG. 9 is a view to show operation at each stage when the number of stages of a row is an odd number;

DESCRIPTION OF PREFERRED EMBODIMENTS

Figure 1:
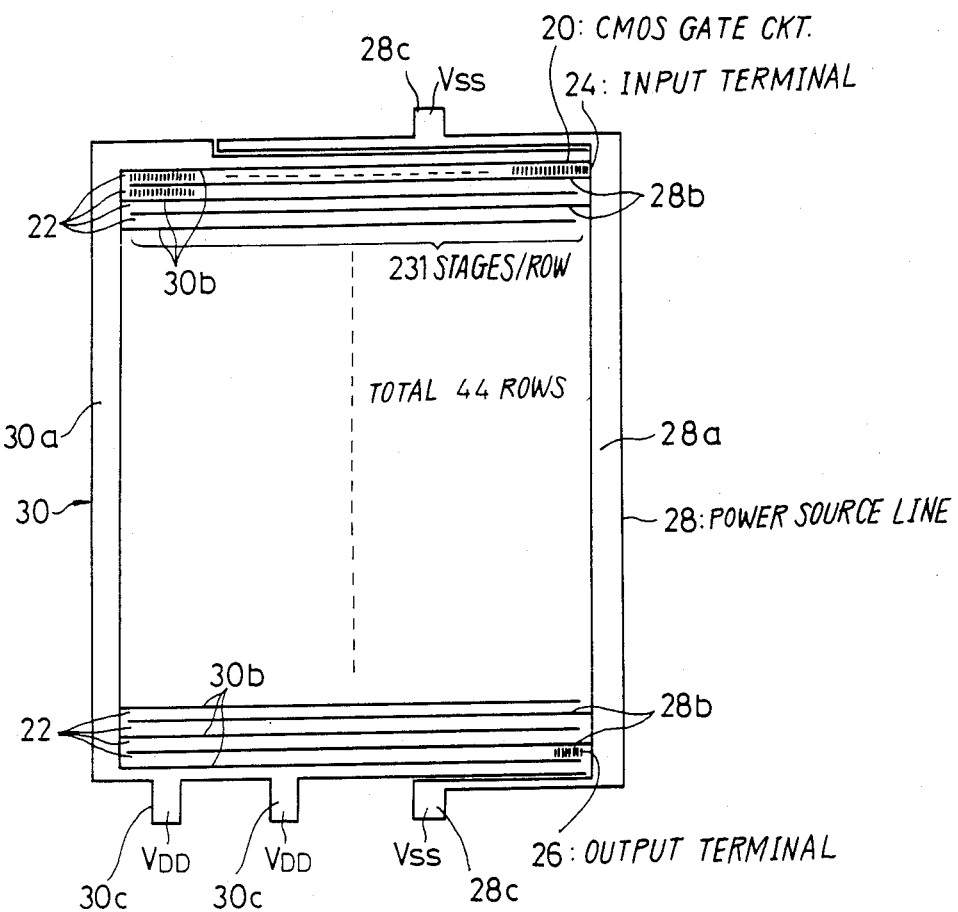
FIG. 1 is an IC chip pattern to show an embodiment according to this invention.
Figure 3:
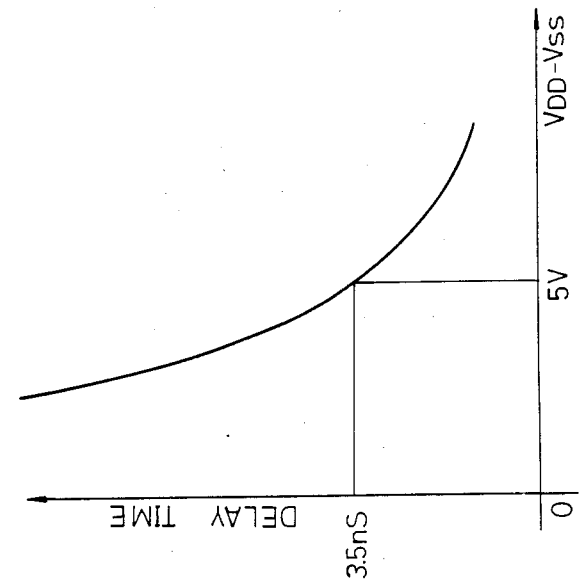
FIG. 3 is a graph to indicate delay characteristics of a CMOS gate circuit.

FIG. 1 shows an embodiment of a chip pattern of CMOS integrated circuits for signal delay according to this invention.

In the chip pattern, each short line 20 represents an individual CMOS gate circuit. A row 22 comprises an odd number of CMOS gate circuits 20 connected in series. The pattern is folded at an end to form the next row and thereby forms a continuous pattern of a signal delay circuit as a whole. A binary signal is applied at an input terminal 24, and a delay output is taken out from an output terminal 26.

A power source line 28 comprises branch lines 28b in a comb form which are lead out from a bus 28a to supply power source voltage $V_{SS}$ to each row 22 via terminals 28c. A power source line 30 comprises branch lines 30b in a comb form which are led out from a bus 30a to oppose the branch lines 28b in a staggered fashion and supplies each row 22 with power source voltage $V_{DD}$ via terminals 30c. The delay time is controlled by such power source voltages $V_{DD}$ and $V_{SS}$.

The stages of CMOS gate circuits 20 in each row 22 are odd numbered, and in this particular embodiment the number is 231, while the number of rows is 44.

The chip pattern of an individual CMOS gate circuit, a component of each row 22, will now be described.

There are two types of chip patterns in the CMOS gate circuit 20 of the present embodiment; i.e. type A for small current and type B for large current. Type B is arranged at the last stage of each row and of the block obtained by dividing each row by odd number of stages while type A is arranged at positions other than above. In this chip pattern, two CMOS gate circuits are united as a set. Two circuits may be grouped; A-A (a set of two As), A-B (a set of type A followed by type B), and B-A (a set of type B followed by type A). As each row comprises an odd number of CMOS gate circuits, there should be prepared a pattern of a single type B to be used at the last stage of each row.

Figure 6:
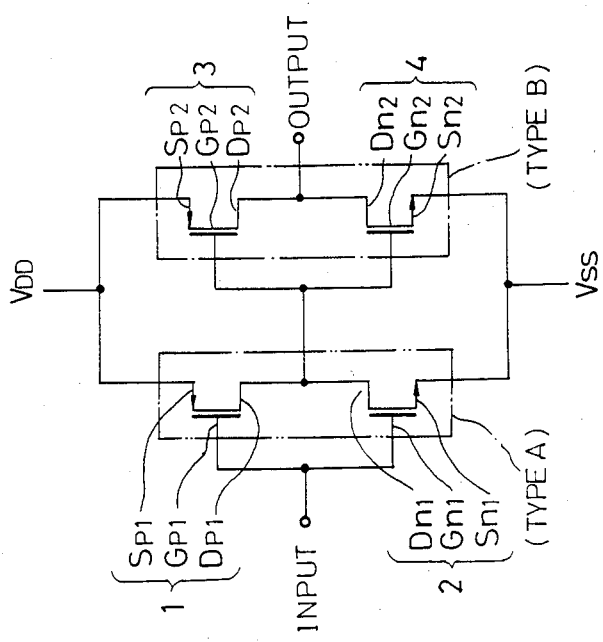
FIG. 6 is an electric circuit diagram of the chip pattern shown in FIG. 5.
Figure 5:
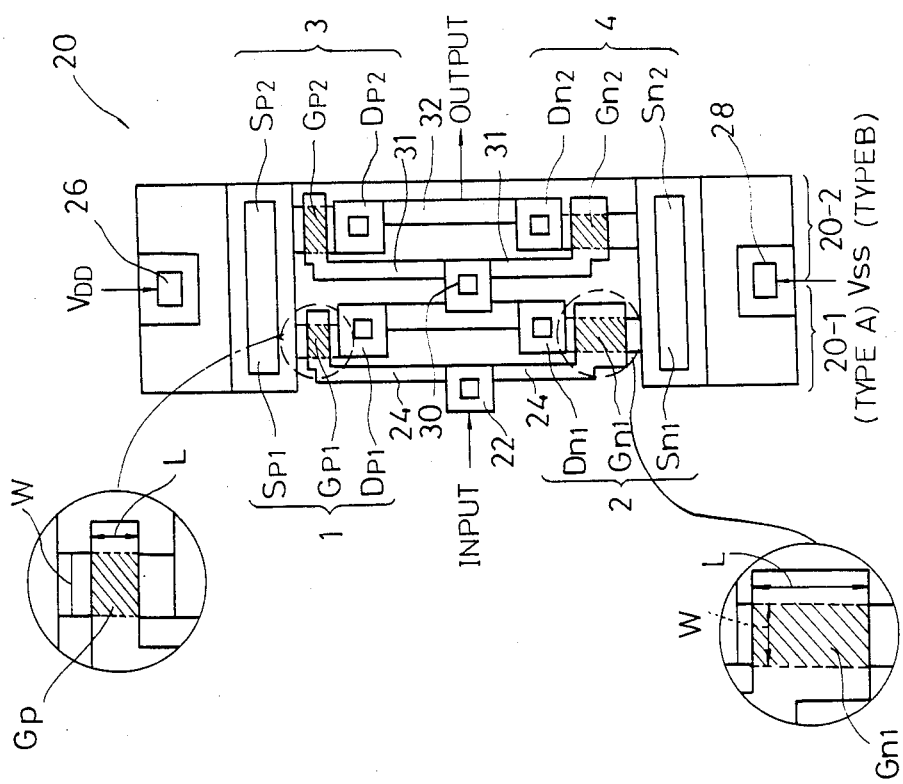
FIG. 5 is a chip pattern view of a couple of CMOS gate circuits to be used in an IC chip pattern.

FIG. 5 shows an example of chip pattern of types A-B. FIG. 6 shows the electric circuit thereof. This CMOS gate circuit comprises type A and B CMOS gate circuits 20 -1, and 20 - 2 in serial connection.

Figure 17:
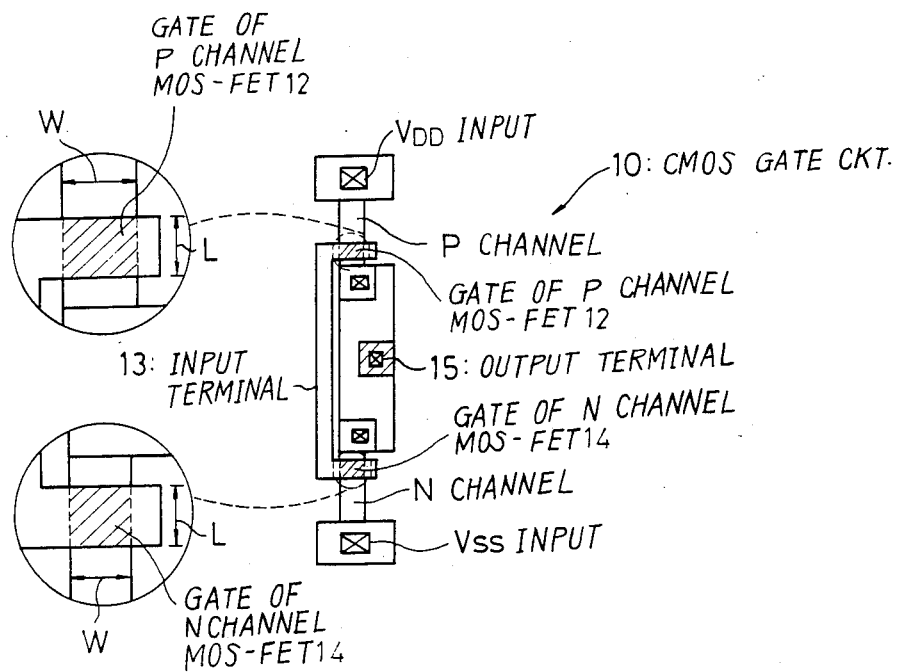
FIG. 17 is an integrated circuit pattern of a conventional CMOS gate circuit.

The chip pattern in a conventional CMOS gate arranges P channel side and N channel side in a symmetrical arrangement as shown in FIG. 17. The one shown in FIG. 5 differs between P channel side and N channel side. If they are arranged symmetrically, there arises difference in the characteristics between the rise portion and the fall portion of an output due to difference in characteristics between P channel and N channel with resulting change in duty factor between input and output pulse waveforms when applied in jitter absorption of pulse-frequency modulation signals in video disc reproduction as described above. The delay circuit then has difficulty in faithful reproduction of recorded data from a disc.

Figure 2:
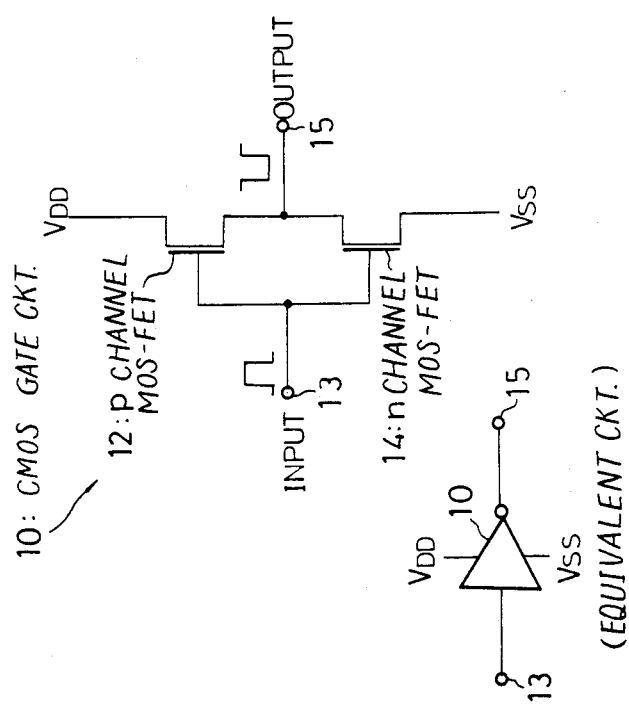
FIG. 2 is a circuit diagram to show a CMOS gate circuit.
Figure 4:
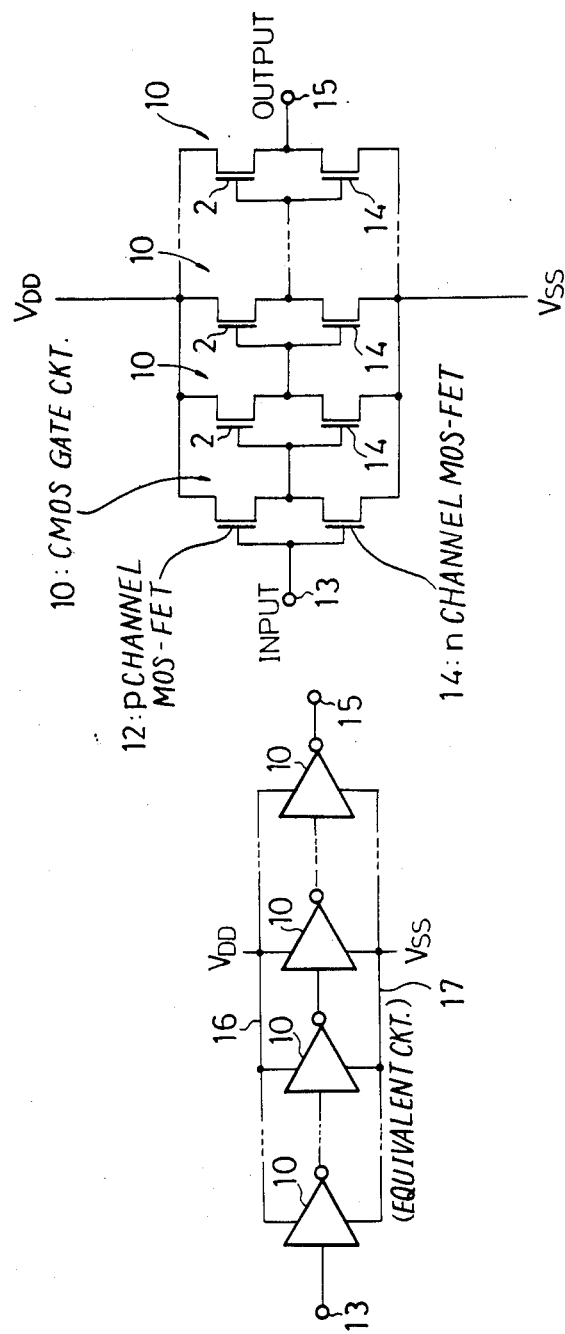
FIG. 4 is a circuit diagram to show a serial connection of CMOS gate circuits.
Figure 18:
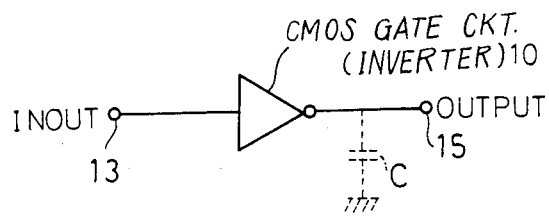
FIG. 18 is an equivalent circuit of this CMOS gate circuit.

In the CMOS gate circuit 10 in FIG. 2, charge and discharge currents flow when its output is inverted owing to load capacity C formed in the output side as shown in FIG. 18 and delay characteristic of the CMOS gate circuit 10 is determined by characteristics of the charge and discharge currents.

The current characteristics of MOS-FET are expressed by the Shockley's equation and can be considered separately in two cases of saturation region and non-saturation region depending upon relative magnitudes of $V_{DS}$ and $(V_{GS}-V_{th})$.

(1) In saturation region, $I_{DS}$ is:

$$I_{DS}=K\{2(V_{GS}-V_{th})V_{DS}-V_{DS}^2\}\dots \quad |V_{DS}|<|V_{GS}-V_{th}| \quad (1.1)$$

(2) In non-saturation region, $I_{DS}$ is:

$$I_{DS}=K(V_{GS}-V_{th})^2 \dots \quad |V_{DS}|\geqq|V_{GS}-V_{th}| \quad (1.2)$$

K is a constant whose value is determined by factors including the type of gate metal, type and thickness of gate insulating material, concentrations of impurities in the substrate silicon, potential difference between the source and the substrate and size of the gate and is expressed by the following equation:

$$K = \frac{W}{L} K' \quad (1.3)$$

$$\text{where } K' = \frac{\mu \epsilon_{ox}}{2 t_{ox}}$$

If the structure and pattern arrangement of a MOS-FET is designed as shown in FIG. 17, L and W represent length and width of channels of the MOS-FET, $\epsilon_{ox}$ and $t_{ox}$ dielectric constant and thickness of gate oxide film, and $\mu$ mobility of carrier in the channels. $V_{th}$ in the above equations can be given by the following equation:

$$V_{th} = \phi_{MS} - \frac{Q_{SS}}{C_{ox}} \pm 2|\phi_F| \quad (1.4)$$

$\phi_{MS}$ represents difference in work function of metal and silicon, $Q_{SS}$ surface level charge density which is + when the substrate is P (N channel MOS-FET) and − when the substrate is N (P channel MOS-FET), and $\phi_F$ Fermi level of the substrate.

In the above equations (1.1) and (1.3), K' and $V_{th}$ are values which are solely determined during the process of manufacture (though there is difference in the value between the P channel and the N channel) and $V_{GS}$ and $V_{DS}$ are external operating voltages with W/L being their variation factor. If, accordingly, the P channel and the N channel are of the same W/L as in the conventional CMOS gate circuit shown in FIG. 17, $I_{DS}$ of the P channel becomes different from $I_{DS}$ of the N channel under the same voltage condition. That is, charge/discharge times of the capacity differs between the P channel and the N channel. Since K' of the P channel is generally smaller, $I_{DS}$ of the P channel is smaller with a result that charge time (rise time $T_R$) is longer and discharge time (fall time $T_F$) is shorter.

Figure 19A:
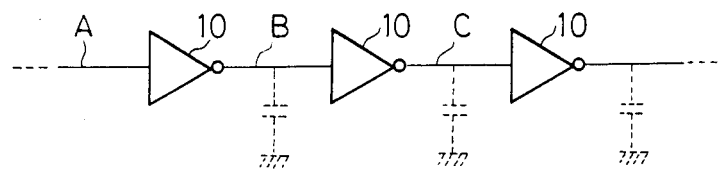
FIGS. 19(a), 19(b) and 19(c) are waveform diagrams showing the signal delay operation by this CMOS gate circuit.
Figure 19B:
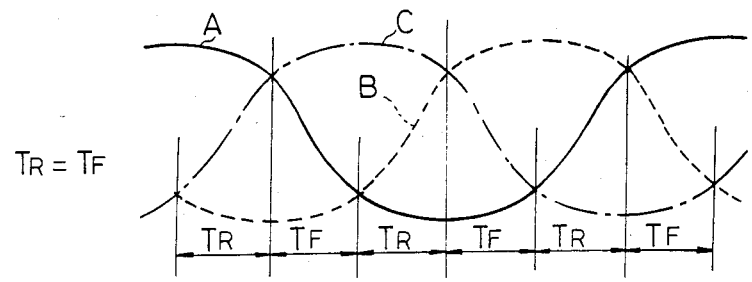
Figure 19C:
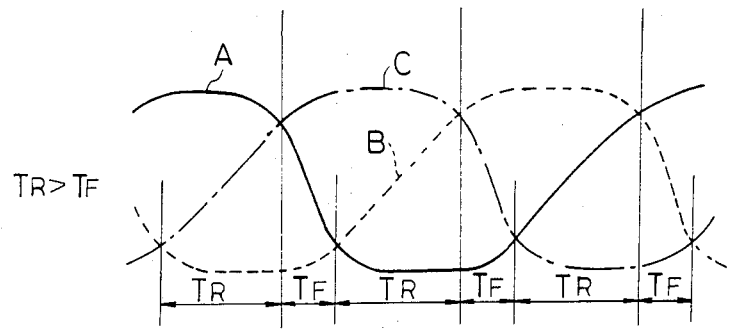
Figure 20:
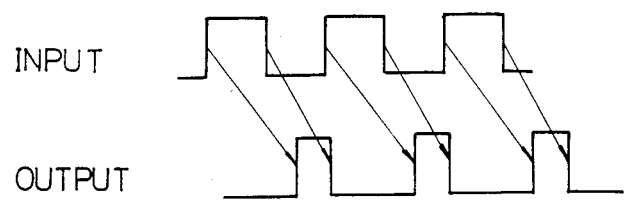
FIG. 20 is a waveform diagram showing distortion in the output waveform due to difference between rise time $T_R$ and fall time $T_F$.

If, accordingly, a plurality of the CMOS gate circuits 10 are serially connected as shown in FIG. 19 (a), a state shown in FIG. 19(b) will be brought about if the condition $T_R=T_F$ is satisfied. Since, however, the condition $T_R>T_F$ prevails in the conventional integrated circuit pattern as shown in FIG. 17, a state shown in FIG. 19(c) results. As a result, as shown in FIG. 20, duty factor of the output signal becomes smaller than that of the input signal. This change in the duty factor causes distortion in waveform (i.e., omission of information in time base) when the circuit is used for, e.g., jitter absorption in a signal reproduced from a video disc resulting in distortion in the reproduced signal. Particularly, as the input signal approaches an upper limit operable frequency, asymmetry in the operation in each stage increases (since voltage fails to reach the power source voltage $V_{DD}-V_{SS}$ at the end of charge or discharge time) with resulting increase in distortion in the reproduced signal.

In order to avoid such an inconvenience, the width and length of gate patterns of N and P channel elements are adjusted, as shown in FIG. 5, in such a manner that the value of operating current of each channel element becomes equal when the same external voltage condition is given to each channel element. By this arrangement, the rise time $T_R$ and the fall time $T_F$ become equal to each other and the waveform distortion between the input and output signals can thereby be prevented.

A CMOS gate circuit 20 - 1 comprises a P channel MOS-FET 1 and an N channel MOS-FET 2. An input signal via a line 24 is applied to gates $G_{p1}$, $G_{n1}$ through a terminal 22 at the first stage 20 - 1. The power source $V_{DD}$ is applied at a source $S_{p1}$ via an electrode 26. The power source $V_{SS}$ is applied at a source $S_{n1}$ via an electrode 28. The output signals from drains $D_{p1}$, $D_{n1}$ are applied at gates $G_{p2}$ and $G_{n2}$ at the second stage 20 - 2 via a line 31 through a terminal 30.

At the second stage 20 - 2, the power source $V_{DD}$ is applied at a source $S_{p2}$ via the electrode 26. The power source $V_{SS}$ is applied at a source $S_{n2}$ via the electrode 28. The output signals from drains $D_{p2}$ and $D_{n2}$ are taken out via a terminal 32.

The CMOS gate circuit 20 - 1 of type A is adjusted to have suitable width (W)/Length (L) of the gates $G_{p1}$ and $G_{n1}$ in a manner to have the same $I_{DS}$ when the same power source voltage $V_{DD}$, $V_{SS}$ is applied on the P channel MOS-FET 1 and N channel MOS-FET 2 depending on the constant K' which is determinable by the structure of each channel element and characterisitics of their materials and the value of threshold voltage $V_{th}$. As a result, W/L of N channel MOS-FET 1 becomes smaller than W/L of P channel MOS-FET 2.

Enlarged views of the gate $G_{p1}$ of the P channel MOS-FET 1 and the gate $G_{n1}$ of the N channel MOS-FET 2 are shown in FIG. 5.

The table below shows an example of dimensions of the gates $G_{p1}$, $G_{n1}$.

|  | Set value (μm) | | Effective value (μm) | | | (μA/V²) | [V] |
|---|---|---|---|---|---|---|---|
|  | W | L | w | l | w/l | K' | $V_{th}$ |
| Pch Element | 4 | 3.0 | 2.5 | 2.0 | 1.250 | 7.500 | −0.7 |
| Nch Element | 4 | 6.5 | 2.5 | 5.5 | 0.455 | 15.000 | 0.7 |

Provided, however, w, l denote effective lengths which are smaller than set values W, L in a manufacture process as shown in the following formula.

$w = W - 1.5$
$l = L - 1.0$

Figure 21:
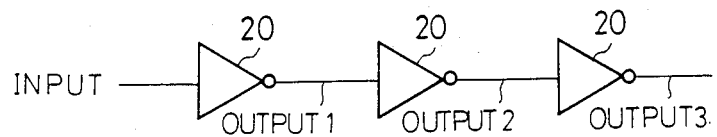
FIG. 21 is a circuit diagram showing a state in which three of the CMOS gate circuit according to the invention are serially connected.
Figure 22:
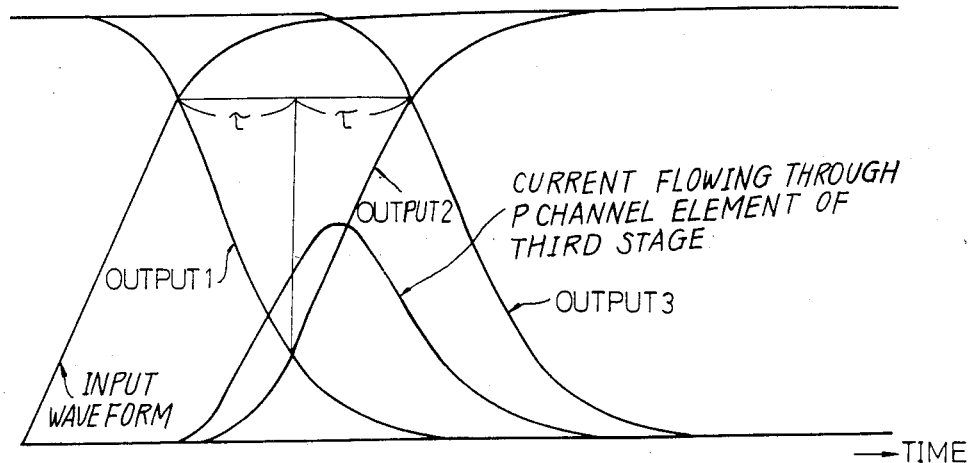
FIG. 22 is a waveform diagram showing the input waveform during rising in the circuit shown in FIG. 21.
Figure 23:
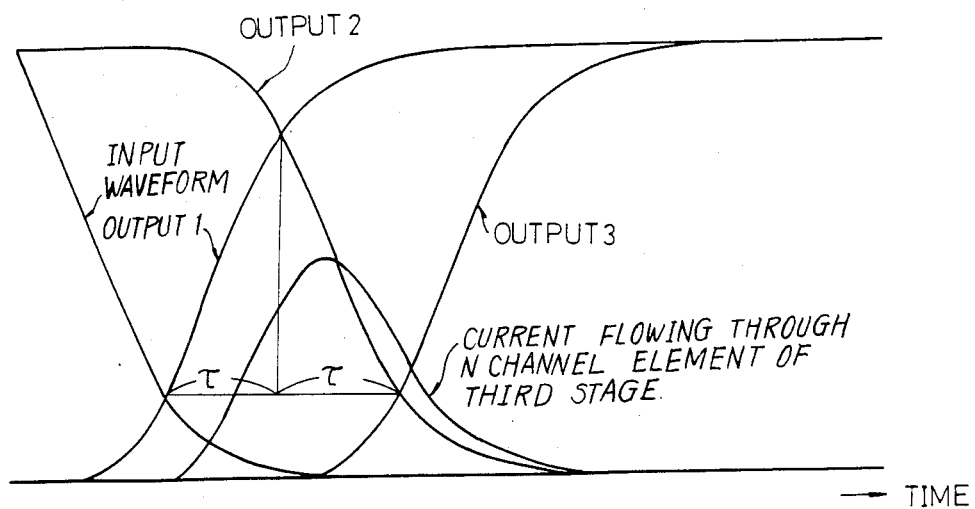
FIG. 23 is a waveform diagram showing the input waveform during falling in the circuit shown in FIG. 21.

In a case where the CMOS gate circuit 20 - 1 of type A is constructed according to these values and three of such CMOS gate circuit 20 - 1 are serially connected as shown in FIG. 21, input and output waveforms thereof are shown in FIGS. 22 and 23. FIG. 22 shown rising of the input waveform while FIG. 23 shows falling.

The CMOS gate circuit 20 - 2 of type B is adjusted to have a suitable width (W)/Length (L) of the gates $G_{p2}$ and $G_{n2}$ depending on K' and $V_{th}$ of each channel element in such a manner that the same $I_{DS}$ is obtained when the same power source valtage $V_{DD}$, $V_{SS}$ is given to the P channel MOS-FET 3 and N channel MOS-FET 4. As a result, W/L of N channel MOS-FET 3 becomes smaller than W/L of P channel MOS-FET 4.

The table below shows an example of dimensions of the gates $G_{p2}$ and $G_{n2}$.

|  | Set value (μm) | | Effective value (μm) | | w/l | K' (μA/V²) | [V] $V_{th}$ |
| --- | --- | --- | --- | --- | --- | --- | --- |
|  | W | L | w | l |  |  |  |
| Pch Element | 5.5 | 3.0 | 4.0 | 2.0 | 2.000 | 7.500 | −0.7 |
| Nch Element | 4.0 | 4.5 | 2.5 | 3.5 | 0.714 | 15.000 | 0.7 |

In the above design, type B has 1.6 times more of the current supply capacity than type A.

The chip pattern shown in FIG. 1 using these CMOS gate circuits 20 will now be described in more detail.

(1) Array of CMOS Gate Circuit 20 and Structure of Power Source Line

Figure 7:
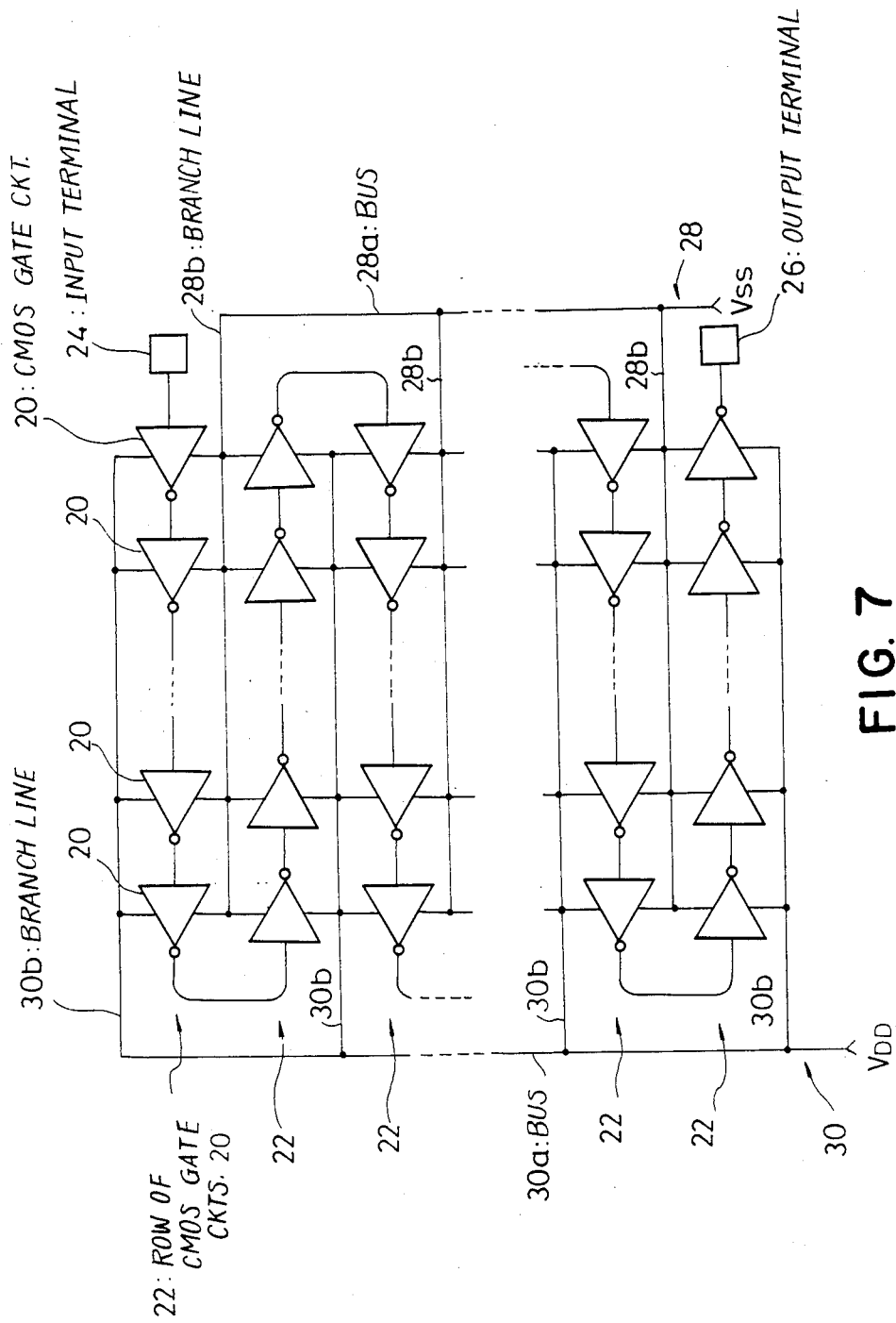
FIG. 7 is an electric circuit diagram of the chip pattern shown in FIG. 1.

The electric circuit of the chip pattern shown in FIG. 1 is shown in FIG. 7. The chip pattern is formed by folding a continuous pattern comprising CMOS gate circuits 20 in multiple-stage connection to have an odd number of circuits in each row and signals applied at an input terminal 24 are delayed at each stage and taken out from an output terminal 26. By this arrangement, a large number of CMOS gate circuits 20 ca be effectively arranged on a limited space of a chip substrate.

The power source line 28 is led out by comb-like branch lines 28b from a bus 28a to supply power source voltage $V_{SS}$ to each CMOS gate circuit 20. The power source line 30 is led out from a bus 30a by comb-like branch lines 30b to supply power source $V_{DD}$ to each CMOS gate circuit 20.

In the structure with power source lines 28, 30, plural branch lines 28b and 30b are led out from buses 28a and 30a so that the length of wired power source lines can be reduced remarkably compared to the conventional arrangement where two power source lines must supply power source voltage $V_{SS}$, $V_{DD}$ to all the CMOS gate circuits 20 to thereby prevent an increase in impedance in power source lines. As a result, unexpected fluctuation in power source voltage can be prevented and the delay time can be controlled excellently. Furthermore, as one branch line 28b or 30b involves only two rows of CMOS gate circuits 20, a local voltage change rarely influences other parts.

(2) The Number of CMOS Gate Circuits 20 in One Row 22

Each CMOS gate circuit 20 per se is adjusted in the width (W)/length (L) of gate in a manner to make current characteristics of P and N channels identical. However, even after such an adjustment, a slight difference may possibly be caused between $t_r$ (delay time entailed by inversion in rising) and $t_f$ (delay time entailed by inversion in falling) of each CMOS gate circuit 20.

Delay time ($T_r$, $T_f$) for one row 22 as a whole will now be discussed.

(A) In Case Where One Row 22 Comprises CMOS Gate Circuits 20 In An Even Number Stage For simplicity's sake, a linear arrangement is considered first. It is assumed that the number of stages is 200 as shown in FIG. 8.

The delay time $T_r$ at one row 22 as a whole for the rise portion a of an input signal and the delay time $T_f$ at one row 22 as a whole for the fall portion b thereof are expressed as below:

$$T_r = 100 t_f + 100 t_r$$

$$T_f = 100 t_r + 100 t_f$$

If it is assumed that the rising delay times $t_r$ are the same for all the stages of CMOS gate circuits while the falling delay times $t_f$ are the same for all the stage thereof, even if $t_r \neq t_f$, the equation $T_r = T_f$ will hold ($= T_0$). The difference ΔT between the delay times of rising and of falling can be expressed as $$\Delta T = T_r - T_f = 0.$$

In other words, there is no change (or no delay time distortion) in duty factor between input waveform and output waveform.

Considering the folding portion 36, the load capacity at the folding position becomes (1+K) compared to the standard load (1) at other portions or an increase of load capacity by K at the final stage (the 200th stage) arises due to the patterned wiring at the portion 36. The delay time $T_r$ and $T_f$ can be expressed as below:

$$T_r = 100 T_f + (100 + K) t_r = T_0 + K \cdot t_r$$

$$T_f = 100 T_r + (100 + K) t_f = T_0 = K \cdot t_f$$

If delay times at respective stages have the relation of $t_r = t_f$, the relation below holds;

$$\Delta T = T_r - T_f = 0$$

However, this relation is difficult to realize in practice. Therefore, the relation of $t_r \neq t_f$ usually prevails and in this case, the difference ΔT between the delay time at rising and that at falling is expressed as follows.

$$\Delta T = |T_r - T_f| = K |(t_r - t_f)|$$

If there are n rows, the difference as a whole chip will be $$n \cdot \Delta T = n \cdot K |(t_r - t_f)|.$$

Therefore, in case where one row comprises an even number of stages, the following difference is caused;
(The difference between $t_r$ and $t_f$ in gates at the last stage of each row) X K.

In other words, the difference by the above amount is caused in each stage, thereby accumulating difference in the delay time as a whole chip between rising and falling to a large value. This changes duty factor in input/output waveforms to cause delay time distortion. In the case of pulse frequency modulation signals, it leads to a change in modulated content (or distortion in time base).

(B) In Case Where One Row 22 Comprises CMOS Gate Circuit 20 In An Odd Number Stage It is assumed that one row 22 comprises 201 stages as shown in FIG. 9.

The delay time $T_{r1}$ in one row 22 as a whole for the rise portion a of an input signal and the delay time $T_{f1}$ in one row 22 as a whole for the fall portion b can be expressed as below;

$$T_{r1} = 100t_f + 100t_r + t_r(1+K)$$

$$T_{f1} = 100t_r + 100t_f + t_r(1+K)$$

The difference $\Delta T_1$ in delay time between rising and falling is expressed as below;

$$\Delta T_1 = T_{r1} - T_{f1}$$
$$= t_r(1+K) - t_r(1+K)$$

As one row 22 comprises an odd number of stages, if an input in one row is rising the input in the next row becomes falling.

The delay times $T_{r2}$, $T_{f2}$ in the next row therefore become as below;

$$T_{r2} = 100t_r + 100t_f + t_r(1+K)$$

$$T_{f2} = 100t_f + 100t_r + t_r(1+K)$$

The difference $\Delta T_2$ in delay times is expressed as below;

$$\Delta T_2 = T_{r2} - T_{f2} = t_r(1+K) - t_r(1+K)$$

When we consider the two rows as a unit, the difference in delay time between rising and falling is offset as the equation below holds;

$$\Delta T_1 + \Delta T_2 = 0$$

In other words, if one row 22 comprises an odd number of stages and if the number of rows n of one chip is an even number, the difference in delay time between rising and falling will become zero. This means that there will be no delay time distortion in output waveforms. Moreover, even if n is an odd number, the difference will be limited to $\Delta T_1$ or $\Delta T_2$ which is the delay time difference for one row 22.

In the embodiment shown in FIG. 1, the delay time distortion in output waveforms is completely offset by setting the number of stages of one row 22 at 231 and the number of rows for the chip at 44.

(3) Increase in Current Supply Capacity at Folding Portion of Each Row

In above (2), the difference in delay time between rising and falling is offset by setting the number of stages for one row 22 at an odd number. The difference will be more completely offset in a chip as a whole irrespective of the number of rows if the increase of K due to the increase in load capacity at the folding portion 36 should be offset for each row.

Figure 10:
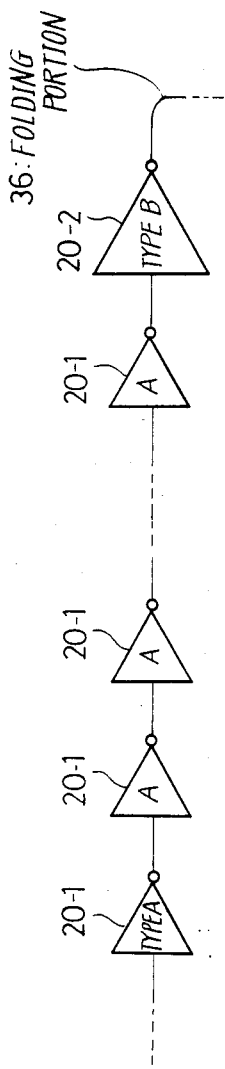
FIG. 10 is a circuit diagram where B type CMOS gate circuit 20 - 2 having a larger current supply capacity is arranged at the last stage in a row 22.

In order to achieve such, as shown in FIG. 10, the current supply capacity of the CMOS gate circuit 20 at the last stage of each row should be increased in correspondence to the increase of K due to the increase in load capacity. More particularly, driving capacity of a CMOS gate circuit is increased to (1+K) times magnitude of type A by using type B 20 - 2 shown in FIG. 5 so as to correspond to the increase of K value.

Such a structure has another merit that the upper limit of frequencies of delayable signals will not be lowered. More specifically, when the current supply capacity at the folding portion 36 of a CMOS gate circuit is the same as other portions, the load capacity increases in response to the increase of K value and it takes more time for charging/discharging the capacity, thereby increasing the delay time more than those at the other portion. In other words, it takes more time for signal inversion. It therefore cannot quite follow the input changes at high frequencies. Unless the folding portion 36 is strengthened, it will become a bottle neck lowering the upper limit of operable frequencies and in the worst case, causing signals to disappear midway of stages.

But if type B of CMOS gate circuit 20 - 2 which has a large current supply capacity is used at the last stage of each row as described above, such a problem can be solved.

(4) Dividing a Row 22 Into Blocks

Figure 11:
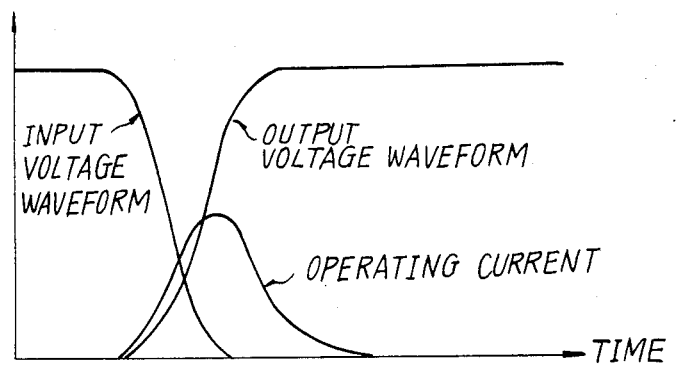
FIG. 11 is a waveform diagram to show the operation of a CMOS gate circuit.
Figure 12A:
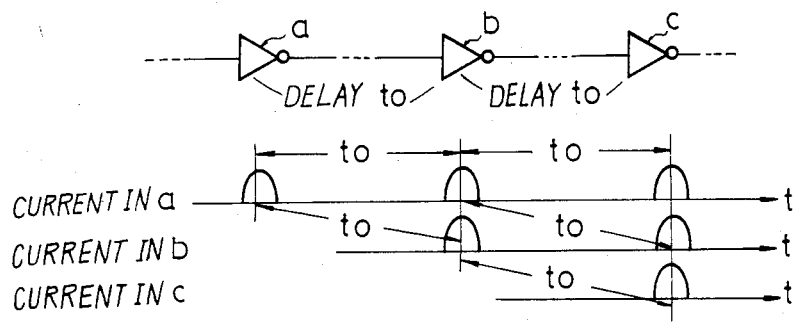
FIGS. 12(a) and 12(b) are an explanatory view of current concentration phenomena.
Figure 12B:
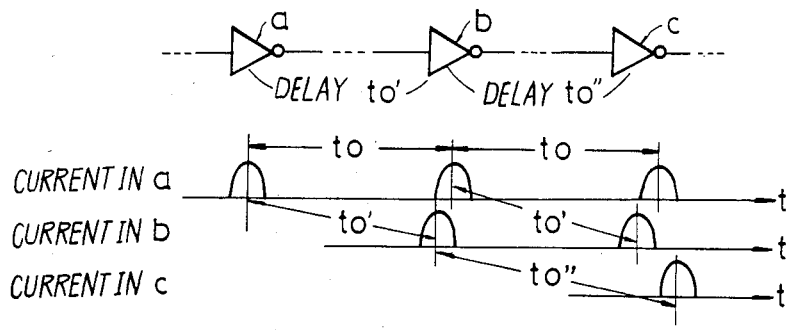

If aperiodical signal is applied at a delay circuit comprising a large number of CMOS gate circuits having the same delay time in serial connection and the period thereof coincides with an integer multiple of the delay time, CMOS gate circuits with stages of the integer in between operate at the same timing. When CMOS gate circuits operate, operating current as shown in FIG. 11 flows in the power source lines. In this case, the current in the amount equivalent to the number of circuits which operate at the same timing flows in the power source lines. As impedance of a certain level always exists in the power source lines, if the concentration of current reaches a certain degree, unexpected power source voltage drop will occur at each period to give adverse influence to the delay time control operation. Pulse frequency modulated signals for video discs are standardized to vary the period thereof between frequencies 7.6–9.3 MHz. Regardless of the value of the delay time, so long as it is the same for a group of circuits, such phenomenon as the concentration of operating currents always and unavoidably occurs at a certain frequency. The phenomenon occurs because the CMOS gate circuits a,b,c . . . rise and fall at the same timing as shown in FIG. 12a. The operating timing should be staggered to solve the problem. In other words, delay time among the circuits a, b and c should be set at different values as shown in FIG. 12b.

Figure 13:
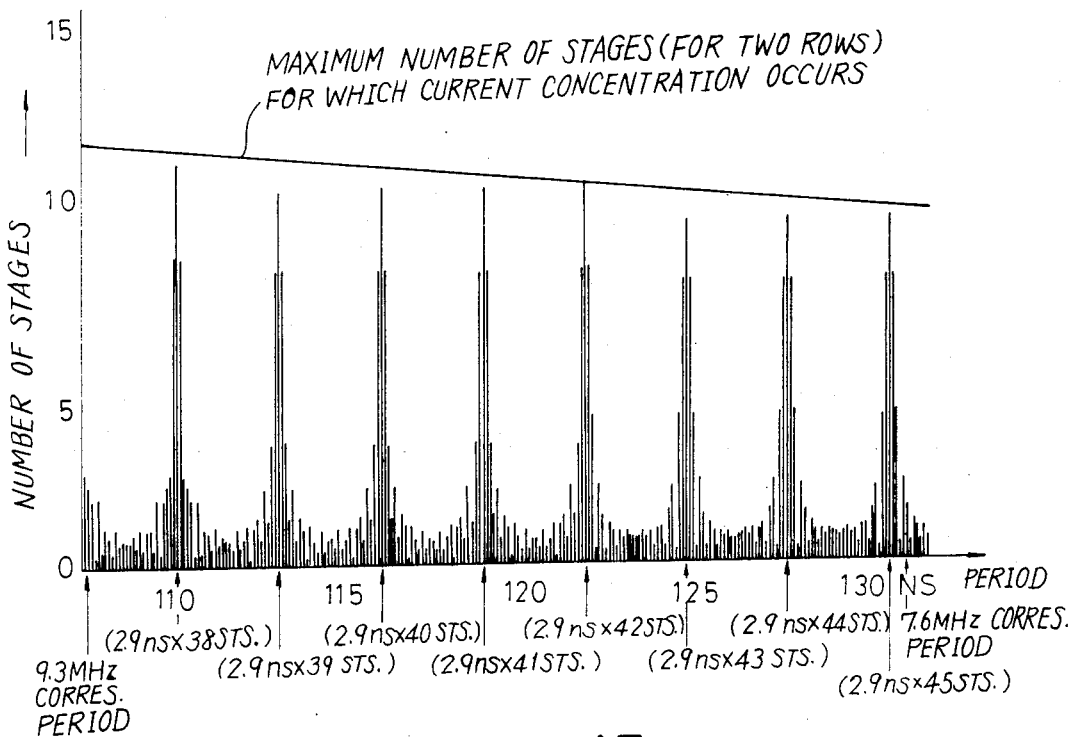
FIG. 13 is a graph to show how operating current changes in relation to the period of input signals when the pattern is structured in all the stages with A type CMOS gate circuits 20 - 1 having the delay time of 2.9 ns for one stage.

FIG. 13 shows the changes of operating currents against the period of input signals in two rows which are related to one branch line of the current line 28 when one row comprises 231 stages of type A 20 - 1 and the delay time for one stage is set at 2.9 ns. The changes are shown in the graph for the scope of 7.6–9.3 MHz which is mentioned above, and the direct current component is removed to indicate only the alternating component in the operating current. The sloped line in the upper portion of the graph represents the maximum number of stages of current concentration which theoretically could occur in two rows. This maximum number of stages corresponds to all the values of currents in the two rows when the operating current value for one stage is set as a reference 1. Accordingly, the operating current concentration occurs at multiples of 2.9 ns by integers such as 110.2 ns (equivalent to the delay time for 38 stages), 113.1 ns (for 39 stages), 116.0 ns (40 stages), 118.9 ns (41 stages), 121.8 ns (42 stages), 124.7 ns (43 stages), 127.6 ns (44 stages), and 130.5 ns (45 stages).

Figure 14:
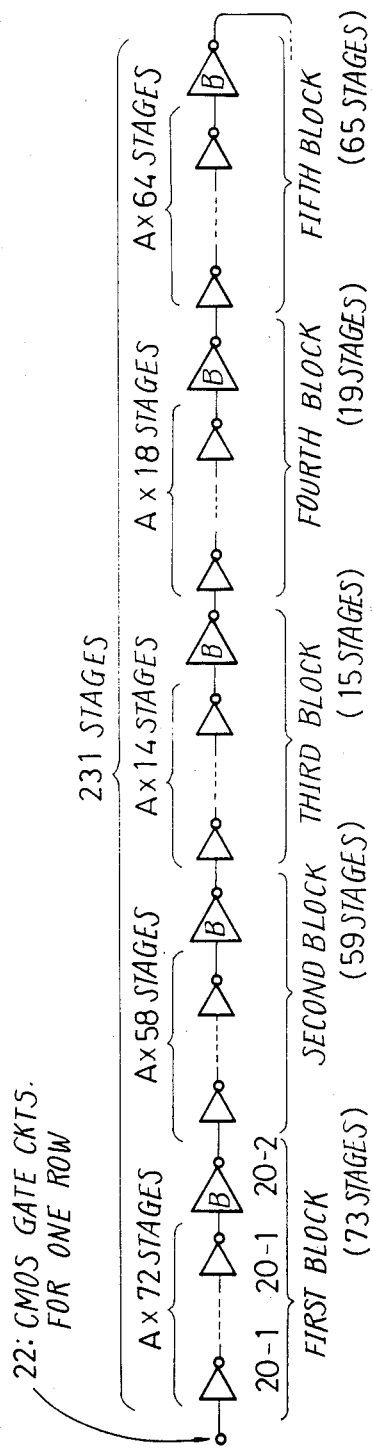
FIG. 14 shows a structure where each row 22 is divided into blocks of an odd number comprising an odd number of CMOS gates 20, and B type CMOS gate circuit 20-2 having a larger current supply capacity is placed at the last gate of each block.

In order to prevent operating current from becoming concentrated, operating timing should be suitably varied within a row 22 by dividing, as shown in FIG. 14, a row into blocks in an odd number each comprising CMOS gate circuits 20 in an odd number and arranging type B 20 - 2 of FIG. 5 with a larger current supply capacity at the last gate of each block to thereby make the structure non-periodical.

If the numbers of stages in every blocks are set different from each other, the operating current can be dispersed for all the range of frequencies. In selecting the number of stages, the range of input signal frequencies should be considered for two periods and therefore, the numbers should be chosen in a manner to stagger timing. In the case of a video signals from a video disc, for example, it the delay time for one stage is set at 2.9 ns, coincidence in timings for two periods will appear in the numbers of stages shown in the Table.

| Signal | Frequency | Period (ns) | Corresponding number of stages | |
|---|---|---|---|---|
| | | | 1 period | 2 periods |
| WHITE | 9.3 | 107.5 | 37.1 | 74.1 |
| 75% | 9.0 | 111.1 | 38.3 | 76.6 |
| 50% | 8.7 | 114.9 | 39.6 | 79.2 |
| 25% | 8.4 | 119.0 | 41.0 | 82.1 |
| BLACK | 8.1 | 123.5 | 42.6 | 85.2 |
| period | 7.6 | 131.6 | 45.4 | 90.8 |

Accordingly, the number of stages in a block should be determined by removing the values in proximity of the stages shown in the table and constructing one row with, for instance, 73, 59, 15, 19 and 65 in combination.

Figure 15:
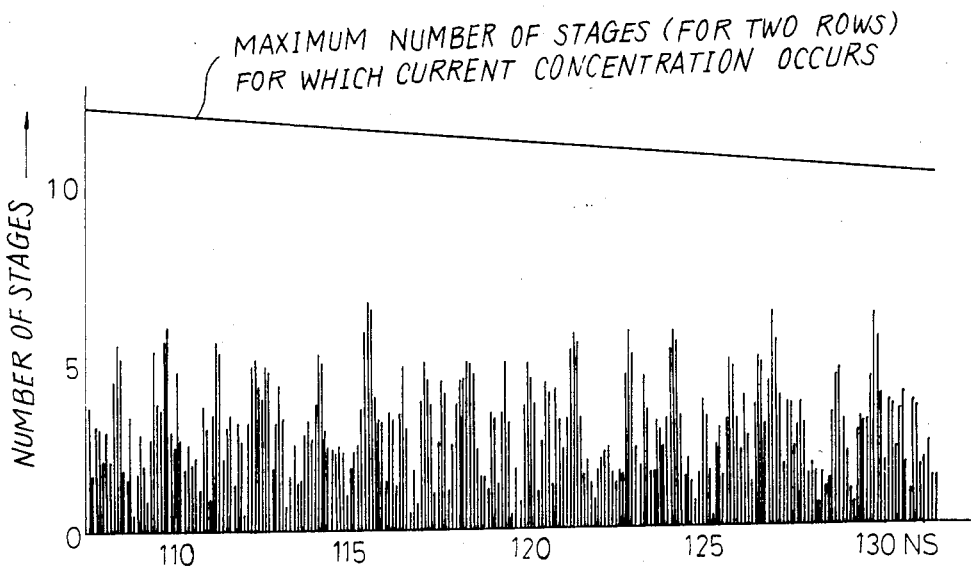
FIG. 15 is a graph to show changes in operating current in relation to the period of input signals in the structure shown in FIG. 12.

FIG. 15 shows changes in the operating current for two rows in relation with the periods of input signals. This indicates that operating currents are distributed across all the range of frequencies.

As the number of stages in each block is made an odd number and B-type 20 - 2 is arranged at the last stage thereof, if we look at the B-type 20 - 2 alone, the delay time $T_f$ for rise portions of all the input signals coincides with the delay time $T_r$ for fall portions of all the signals. Thus, there no waveform distortions are caused. Even if a B-type 20 - 2 is placed midway in the row 22, as the B-type 20 - 2 operates at a high speed, it will not influence the upper limit of operable frequencies.

The problem of current concentration may be considered taking each branch line 28b or 30b as a unit. Therefore, it will suffice if the above processing should be effected in the unit of two rows on which one branch line could influence.

Figure 16:
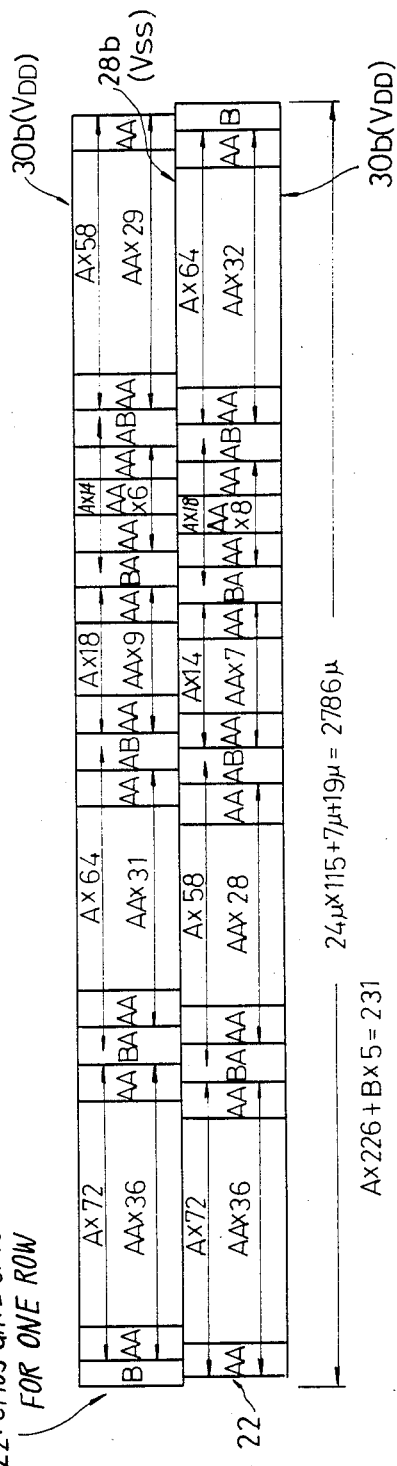
FIG. 16 is a view to show an arrangement of two rows of CMOS gate circuits in the chip pattern shown in FIG. 1.

FIG. 16 shows an example of chip pattern for two rows which is structured by giving due consideration to the above points. In the figure, the characters [AB] denote a combination of A-type 20 - 1 and B-type 20 - 2 as shown in FIG. 5, [BA] a combination of A and B types in the reverse order, [AA] a combination of two As, and [B] a pattern with a single B-type 20 - 2.

What is claimed is:

1. A CMOS integrated circuit for signal delay comprising a predetermined number of CMOS gate circuits connected in series between an input terminal and an output terminal to receive an input binary signal at said output terminal and output a replica of the input binary signal at said output terminal which is delayed by a predetermined delay time, said series of CMOS gate circuits being arranged in a folded pattern of more than two rows on an interated circuit substrate, wherein each row of said folded pattern is formed by an odd number of said CMOS gate circuits.

2. A CMOS integrated circuit as defined in claim 1 wherein for each row, a CMOS gate circuit having a current capacity larger than that of another CMOS gate circuit of the same row is provided at the output end of that row.

3. A CMOS integrated circuit as defined in claim 2 wherein each row of said folded pattern includes an odd number of blocks each of which is formed by an odd number of CMOS gate circuits and has a CMOS gate circuit having a current capacity larger than that of another CMOS gate circuit of the same block as the output stage of that block.

4. A CMOS integrated circuit as defined in claim 3 wherein the number of CMOS gate circuits forming at least two of said blocks are different.

5. A CMOS integrated circuit as defined in claim 1 wherein each of said CMOS gate circuits includes an N channel element and a P channel element connected to conduct one or the other of a change current and a discharge current and wherein gate patterns of the respective channel elements have their width and length dimesnions adjusted in such a manner that the charge and discharge current of these elements become substantially equal to each other when the same external voltage has been applied to these elements.

6. A CMOS integrated circuit as defined in claim 5 wherein the ratio of width to length of the gate pattern of the N channel element is smaller than that of the gate pattern of the P channel element.

7. A CMOS integrated circuit as defined in claim 6 wherein for each row, a CMOS gate circuit having a current capacity larger than that of another CMOS gate circuit in the same row is provided as the output stage of that row.

8. A CMOS integrated circuit as defined in claim 7 wherein eah row of said folded pattern includes an odd number of blocks each of which is formed by an odd number of CMOS gate circuits and has a CMOS gate circuit having a current capacity larger than that of another CMOS gate circuit of the same block as the output stage of that block.

9. A CMOS integrated circuit as defined in claim 8 wherein the number of CMOS gate circuits forming at least two of said blocks are different.

10. An integrated delay circuit comprising:
an integrated circuit substrate;
first and second comb-shaped conductors, each having fingers interleaved with the fingers of the other, disposed in spaced apart fashion on the substrate; and
a series connected chain of individual CMOS delay circuits serpentinely disposed in cascaded fashion on the substrate in the space between the interleaved fingers of the first and second conductors to thus form an overall delay equal to the sum of the individual CMOS delay circuits, each of the CMOS delay circuits having first and second power supply electrodes respectively connected to the nearest interleaved fingers of the first and second conductors.

11. An integrated delay circuit according to claim 10 wherein the series connected chain has a predetermined number of CMOS delay circuits, an odd number of the CMOS delay circuits is disposed between each pair of adjacent interleaved fingers to define a row, and at least two CMOS delay elements in each row have substantially different current conduction capacities.

12. An integrated delay circuit according to claim 10 wherein the series connected chain has a predetermined number of CMOS delay circuits, an odd number of the CMOS delay circuits is disposed between each pair of adjacent interleaved fingers to define a row, and at least two CMOS delay elements in each row have substantially different signal delay times.

* * * * *